United States Patent
Suzuki et al.

(10) Patent No.: US 10,629,801 B2
(45) Date of Patent: Apr. 21, 2020

(54) LAMINATED STRUCTURE AND SPIN MODULATION ELEMENT

(71) Applicant: TDK CORPORATION, Tokyo (JP)

(72) Inventors: Eiji Suzuki, Tokyo (JP); Katsuyuki Nakada, Tokyo (JP); Shogo Yonemura, Tokyo (JP)

(73) Assignee: TDK CORPORATION, Tokyo (JP)

( * ) Notice: Subject to any disclaimer, the term of this patent is extended or adjusted under 35 U.S.C. 154(b) by 11 days.

(21) Appl. No.: 15/943,048

(22) Filed: Apr. 2, 2018

(65) Prior Publication Data

US 2018/0351079 A1 Dec. 6, 2018

(30) Foreign Application Priority Data

May 31, 2017 (JP) ................. 2017-108300

(51) Int. Cl.
*H01L 43/02* (2006.01)
*H01L 43/08* (2006.01)
(Continued)

(52) U.S. Cl.
CPC ............ *H01L 43/02* (2013.01); *G01R 33/093* (2013.01); *G01R 33/096* (2013.01);
(Continued)

(58) Field of Classification Search
CPC .. G11B 5/012; G11B 5/02; G11B 5/65; G11B 5/66; G11C 11/15; G11C 11/161; G11C 11/1675; G11C 11/1677; G11C 11/16; G11C 11/22; G11C 11/5607; G11C 11/1659; G11C 11/2275; G11C 11/005; G11C 11/1673; G11C 11/221; G11C 11/5678; G11C 13/00; G11C 13/0004; G11C 13/02; G11C 13/06; H01F 10/3268;
(Continued)

(56) References Cited

U.S. PATENT DOCUMENTS

| 7,573,734 B2 | 8/2009 | Grino et al. |
| 7,750,390 B2 * | 7/2010 | Saito ............ G11C 11/16 257/314 |

(Continued)

FOREIGN PATENT DOCUMENTS

| JP | 2016-063024 A | 4/2016 |
| JP | 2016-063062 A | 4/2016 |

(Continued)

OTHER PUBLICATIONS

Naoki Wakiya et al., "Orientation Control and Properties of Pb(Zr, Ti)O3 Thin Films Deposited on Ni—Zn-Ferrite for Novel Ferroelectric/Ferromagnetic Memory Applications," 2002 Jpn. J. Appl. Phys. 41 7242 (Year: 2002).*

(Continued)

*Primary Examiner* — Mark W Tornow
*Assistant Examiner* — Priya M Rampersaud
(74) *Attorney, Agent, or Firm* — Oliff PLC

(57) ABSTRACT

A laminated structure includes a ferromagnetic layer, a multiferroic layer provided on one surface of the ferromagnetic layer, and a ferroelectric layer which is provided on the multiferroic layer opposite to the ferromagnetic layer and has a permittivity greater than that of the multiferroic layer.

12 Claims, 3 Drawing Sheets

(51) Int. Cl.
*G01R 33/09* (2006.01)
*H01L 43/12* (2006.01)
*H01L 43/10* (2006.01)
*H01F 10/193* (2006.01)
*H01F 10/32* (2006.01)

(52) U.S. Cl.
CPC ..... *H01F 10/1933* (2013.01); *H01F 10/1936* (2013.01); *H01L 43/08* (2013.01); *H01L 43/10* (2013.01); *H01L 43/12* (2013.01); *H01F 10/3254* (2013.01)

(58) Field of Classification Search
CPC ............. H01F 10/3254; H01F 10/3286; H01F 10/3218; H01F 10/3263; H01F 10/3272; H01F 41/046; H01F 41/302; H01F 41/307; H01F 10/1933; H01F 10/1936; G01R 33/093; G01R 33/1284; G01R 33/096; H01L 43/08; H01L 43/10; H01L 27/228; H01L 27/222; H01L 2924/0002; H01L 27/11502; H01L 27/11507; H01L 27/224; H01L 2924/00; H01L 43/02; H01L 2225/06527; H01L 23/66; H01L 25/0657; H01L 27/11585; H01L 27/226; H01L 27/24; H01L 27/2409; H01L 27/2436; H01L 27/2463; H01L 28/55; H01L 29/40111; H01L 29/66984; H01L 29/82; H01L 37/02; H01L 41/22; H01L 43/12; H01L 45/04; H01L 45/06; H01L 45/085; H01L 45/1233; H01L 45/14; H01L 45/146; H01L 45/147; H01L 51/0062; H01L 51/0078

See application file for complete search history.

(56) References Cited

U.S. PATENT DOCUMENTS

| | | | | |
|---|---|---|---|---|
| 8,280,210 | B2 * | 10/2012 | Chowdhury | G02F 1/0009 333/239 |
| 9,356,224 | B2 | 5/2016 | Zeches et al. | |
| 9,520,175 | B2 | 12/2016 | Shibata et al. | |
| 9,564,581 | B1 * | 2/2017 | Choi | H01L 43/08 |
| 2008/0145693 | A1 * | 6/2008 | Zou | G02B 6/132 428/611 |
| 2009/0059424 | A1 * | 3/2009 | Kim | G11B 5/02 360/123.01 |
| 2009/0280355 | A1 * | 11/2009 | Eom | C30B 23/02 428/701 |
| 2010/0102369 | A1 * | 4/2010 | Tian | G11C 11/22 257/295 |
| 2011/0007560 | A1 * | 1/2011 | Dieny | B82Y 25/00 365/171 |
| 2011/0073994 | A1 * | 3/2011 | Liu | C23C 18/1216 257/532 |
| 2014/0043895 | A1 * | 2/2014 | Bibes | H01L 43/08 365/171 |
| 2014/0320994 | A1 * | 10/2014 | Yoshimura | G11B 9/02 360/46 |
| 2015/0123755 | A1 * | 5/2015 | Shibata | H01F 10/3218 335/296 |

FOREIGN PATENT DOCUMENTS

JP 2016-111102 A 6/2016
KR 2010090326 A * 2/2009

OTHER PUBLICATIONS

Hitoshi Tabata et al. "Construction of ferroelectric and/or ferromagnetic superlattices by laser MBE and their physical properties," 1998, Materials Science and Engineering: B, vol. 56, Issues 2-3, pp. 140-146, ISSN 0921-5107 (Year: 1998).*

I. Fina et al. "The direct magnetoelectric effect in ferroelectric—ferromagnetic epitaxial heterostructures," 2013, Nanoscale, 5, 8037 (Year: 2013).*

Tianyi Cai et al., "Magnetoelectric coupling and electric control of magnetization in ferromagnet/ferroelectric/normal-metal superlattices," 2009,Phys. Rev. B 80, 140415(R) (Year: 2009).*

English Translation of Korea publication, KR 2010090326 A . (Year: 2009).*

Yue Wang et al., "Epitaxial growth of BiFeO3 films on TiN under layers by sputtering deposition", AIP Advances 7, 055815, 2017.

* cited by examiner

LAMINATED STRUCTURE AND SPIN MODULATION ELEMENT

CROSS-REFERENCE TO RELATED APPLICATION

Priority is claimed on Japanese Patent Application No. 2017-108300, filed May 31, 2017, the content of which is incorporated herein by reference.

BACKGROUND OF THE INVENTION

Field of the Invention

The present invention relates to a laminated structure and a spin modulation element.

Description of Related Art

Elements utilizing spin in magnetic materials are used for various purposes. Known examples are magnetoresistance effect elements such as a giant magnetoresistance (GMR) element including a multilayer film having a ferromagnetic layer and a nonmagnetic layer and a tunneling magnetoresistance (TMR) element which uses an insulating layer (a tunnel barrier layer or a barrier layer) as a nonmagnetic layer. Magnetoresistance effect elements are used in magnetic sensors, high-frequency parts, magnetic heads, magnetic recording media, nonvolatile random access memories (MRAM), and the like.

A magnetoresistance effect element outputs a resistance change depending on the difference in magnetization direction between two ferromagnetic layers. Setting a state of the magnetoresistance effect element in which the magnetization directions of the two ferromagnetic layers are parallel to "0" and a state in which the magnetization directions of the two ferromagnetic layers are antiparallel to "1" allows the magnetoresistance effect element to output data of two values.

On the other hand, with the recent increase in the volume of data, there is a demand for accumulating data at a higher density. An element capable of recording data in two or more multiple values is under development as a means to meet this demand. For example, Patent Documents 1 and 2 describe elements which can record data in multiple values by modulating the spin polarization rate of a ferromagnetic layer using an electric field.

PATENT DOCUMENTS

Patent Document 1: Japanese Unexamined Patent Application, First Publication No. 2016-63024
Patent Document 2: Japanese Unexamined Patent Application, First Publication No. 2016-63062

SUMMARY OF THE INVENTION

However, the elements described in Patent Documents 1 and 2 may sometimes not generate a sufficient electric field through dielectric polarization and may sometimes not reliably record data in multiple values.

The present invention has been made in view of the above circumstances and it is an object of the present invention to provide a laminated structure and a spin modulation element which can sufficiently modulate the spin polarization rate of a ferromagnetic material through an electric field.

To achieve the above object, the present invention provides the following means.

(1) A laminated structure according to a first aspect includes a ferromagnetic layer, a multiferroic layer provided on one surface of the ferromagnetic layer, and a ferroelectric layer provided on the multiferroic layer opposite to the ferromagnetic layer, wherein the ferroelectric layer has a permittivity greater than a permittivity of the multiferroic layer.

(2) In the laminated structure according to the above aspect, a sum of thicknesses of the multiferroic layer and the ferroelectric layer may be 10 nm or more and 1000 nm or less.

(3) In the laminated structure according to the above aspect, the thickness of the multiferroic layer may be 5 nm or more and 500 nm or less.

(4) In the laminated structure according to the above aspect, the thickness of the ferroelectric layer may be 5 nm or more and 500 nm or less.

(5) In the laminated structure according to the above aspect, the ferroelectric layer may have a relative permittivity of 10 or more.

(6) In the laminated structure according to the above aspect, the ferroelectric layer may be $La_xSr_{1-x}MnO_3$ ($0 \le x \le 1$), $Ba_xSr_{1-x}TiO_3$ ($0 \le x \le 1$), or $PbZr_xTi_{1-x}O_3$ ($0 \le x \le 1$).

(7) In the laminated structure according to the above aspect, the ferromagnetic layer may be a half-metal.

(8) In the laminated structure according to the above aspect, the ferromagnetic layer may include a Heusler alloy represented by a composition formula of $X_2YZ$, where X is a transition metal element or a noble metal element of the Co, Fe, Ni or Cu group on the periodic table, Y is a transition metal of the Mn, V, Cr or Ti group or an element type of X, and Z is a typical element of groups III to V.

(9) In the laminated structure according to the above aspect, the multiferroic layer may include any one selected from the group consisting of $BiFeO_3$, $BiMnO_3$, $GaFeO_3$, $AlFeO_3$, $(Ga, Al)FeO_3$, $YMnO_3$, $CuFeO_2$, $Cr_2O_3$, $Ni_3Bi_7O_{13}I$, $LiMnPO_4$, $Y_3Fe_5O_{12}$, $TbPO_4$, and $LiCoPO_4$.

(10) A spin modulation element according to a second aspect includes the laminated structure according to the above aspect, and a nonmagnetic layer and a second ferromagnetic layer sequentially laminated on the ferromagnetic layer of the laminated structure.

The laminated structure and the spin modulation element according to the above aspects can sufficiently modulate the spin polarization rate of the ferromagnetic material through an electric field.

DETAILED DESCRIPTION OF THE INVENTION

Figure 1:
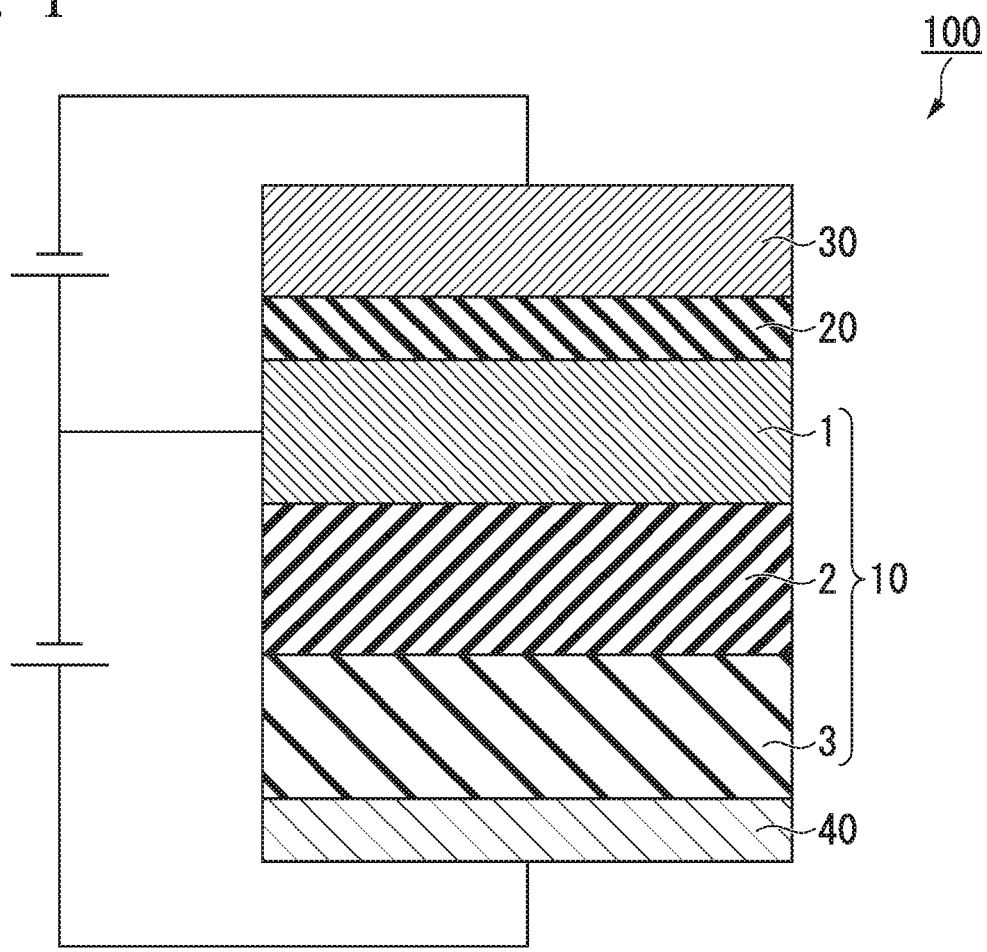
FIG. 1 is a diagram schematically showing a spin modulation element according to an embodiment.

Hereinafter, the preferable configuration of an embodiment will be described with reference to the drawings. In the drawings used in the following description, to make features easy to understand, some characteristic portions may be shown enlarged for the sake of convenience, and the dimensions or the like of each component are not necessarily the same as the actual ones. Materials, dimensions, or the like exemplified in the following description are merely examples and the present invention is not limited thereto.

(Spin Modulation Element)

FIG. 1 is a diagram schematically showing a spin modulation element according to the present embodiment. The spin modulation element 100 shown in FIG. 1 includes a laminated structure 10, a nonmagnetic layer 20, and a second ferromagnetic layer 30.

<Laminated Structure>

The laminated structure 10 includes a ferromagnetic layer 1, a multiferroic layer 2, and a ferroelectric layer 3.

Although FIG. 1 shows the laminated structure 10 as part of the configuration of the spin modulation element 100, the laminated structure 10 alone may be used as an anisotropic magnetoresistance (AMR) sensor or the like.

The ferromagnetic layer 1 includes a magnetic material in which magnetization is oriented in one direction. It is preferable that a substance having strong magnetic anisotropy be used as the magnetic material constituting the ferromagnetic layer 1. For example, a metal selected from the group consisting of Cr, Mn, Co, Fe and Ni and an alloy exhibiting ferromagnetism containing at least one of these metals can be used. An alloy containing these metals and at least one of the element B, C, and N can also be used. Specifically, examples thereof include Fe, Co—Fe, or the like.

It is preferable that the ferromagnetic layer 1 be a half-metal. A half-metal is a substance wherein one electron spin shows a metallic band structure and the other electron spin shows an insulator-like band structure. A half-metal ideally exhibits a high spin polarization rate, which is close to 1, on the Fermi surface.

A Heusler alloy, magnetite ($Fe_3O_4$), perovskite type Mn oxide, and the like are known as half-metals, but it is particularly preferable that a Heusler alloy be employed as the half-metal. The Heusler alloy has features such as high lattice matching with III-V semiconductors, a Curie temperature which is above room temperature, and a large band gap which is near the Fermi surface, and can exhibit a high spin polarization rate even at room temperature.

Heusler alloys include an intermetallic compound having a chemical composition of $X_2YZ$, where X is a transition metal element or a noble metal element of the Co, Fe, Ni or Cu group on the periodic table, Y is a transition metal of the Mn, V, Cr or Ti group and may be any of the element type of X, and Z is a typical element of groups III to V. Examples of the Heusler alloy include $Co_2FeSi$, $Co_2MnSi$, and $Co_2Mn_{1-a}Fe_aAl_bSi_{1-b}$.

The multiferroic layer 2 is formed on one surface of the ferromagnetic layer 1. The multiferroic layer 2 includes a multiferroic material which has combined properties of magnetic ordering and ferroelectric ordering. Any one selected from the group consisting of $BiFeO_3$, $BiMnO_3$, $GaFeO_3$, $AlFeO_3$, $(Ga, Al)FeO_3$, $YMnO_3$, $CuFeO_2$, $Cr_2O_3$, $Ni_3Bi_7O_{13}I$, $LiMnPO_4$, $Y_3Fe_5O_{12}$, $TbPO_4$, and $LiCoPO_4$ may be used as the multiferroic material. Further, a material obtained by substituting some elements of these substances may be used as the multiferroic material as long as the properties are not lost. For example, part of X in the substances denoted as $XYO_3$ may be substituted by another trivalent element or part of Y may be substituted by another element selected from 3d transition metals. The multiferroic material may be a material with oxygen deficiency or the like. Among the above materials, $BiFeO_3$ is particularly preferable because both the Curie temperature and the Neel temperature thereof are high and it exhibits ferroelectric and ferromagnetic properties in a wide temperature range.

The multiferroic layer 2 exerts at least two influences on the ferromagnetic layer 1. The first influence originates from the ferromagnetic properties of the multiferroic layer 2 and the second influence originates from the ferroelectric properties of the multiferroic layer 2.

When the multiferroic layer 2 exhibits ferromagnetic or antiferromagnetic properties, the magnetization direction of the ferromagnetic layer 1 is strongly oriented in one direction due to the influence of the magnetization of the multiferroic layer 2 (first influence). That is, the multiferroic layer 2 has the effect of pinning the magnetization of the ferromagnetic layer 1 due to its ferromagnetic or antiferromagnetic properties of the multiferroic layer 2. When the magnetization of the ferromagnetic layer 1 is strongly fixed (pinned) in one direction, the magnetization direction of the ferromagnetic layer 1 is not disturbed by external factors such as heat, and a rate of change in resistance according to the magnetoresistance effect (MR ratio) increases.

On the other hand, when the multiferroic layer 2 exhibits ferroelectric properties, the multiferroic layer 2 is dielectrically polarized. Charge generated by dielectric polarization induces charge at an interface in the ferromagnetic layer 1 adjacent to the multiferroic layer 2 and an electric field caused by the charge of the interface changes the band structure of the ferromagnetic layer 1, thus modulating the spin polarization rate of the ferromagnetic layer 1 (second influence). Modulation of the spin polarization rate can realize a multi-valued spin modulation element 100. This is because the resistance between the ferromagnetic layer 1 and the second ferromagnetic layer 30 is different, for example, when the spin polarization rate of the ferromagnetic layer 1 is 1.0 with the magnetization direction of the ferromagnetic layer 1 parallel to that of the second ferromagnetic layer 30 and when the spin polarization rate of the ferromagnetic layer 1 is 0.5 with the magnetization direction of the ferromagnetic layer 1 parallel to that of the second ferromagnetic layer 30.

Both the first influence and the second influence are important as influences of the multiferroic layer 2 exerted on the ferromagnetic layer 1. However, the multiferroic layer 2 may sometimes not exhibit sufficient ferroelectric properties since the substances for the multiferroic material constituting the multiferroic layer 2 are limited.

The laminated structure according to the present embodiment includes the ferromagnetic layer 1, the multiferroic layer 2 provided on one surface of the ferromagnetic layer 1, and the ferroelectric layer 3 provided on the multiferroic layer 2 opposite to the ferromagnetic layer 1. The ferroelectric layer 3 includes a dielectric having a permittivity higher than that of the multiferroic layer 2.

The relative permittivity of the ferroelectric layer 3 is greater than the relative permittivity of the multiferroic layer 2. Therefore, the permittivity of a portion constituted by both the ferroelectric layer 3 and the multiferroic layer 2 is greater than that when the portion is constituted by only the multiferroic layer 2. That is, the capacitance of a capacitor formed by the ferromagnetic layer 1, the multiferroic layer 2, the ferroelectric layer 3, and a conductive layer becomes higher, and the absolute amount of charge accumulated at the interface between the multiferroic layer 2 and the ferromagnetic layer 1 becomes higher. As the absolute amount of charge increases, the electric field applied to the ferromagnetic layer 1 increases. Through the above process, it is possible to greatly modulate the spin polarization rate of the ferroelectric layer 1. That is, although the ferroelectric layer 3 is present with the multiferroic layer 2 which is provided between the ferroelectric layer 3 and the ferromagnetic layer 1, the second influence can be sufficiently effectively exerted on the ferromagnetic layer 1.

On the other hand, the first influence is caused by the exchange interaction between the magnetization of the multiferroic layer 2 and the magnetization of the ferromagnetic layer 1. An exchange bias that produces the exchange interaction has a short reach. Therefore, it is preferable that the ferromagnetic layer 1 and the multiferroic layer 2 be close to each other.

The sum of the thicknesses of the multiferroic layer 2 and the ferroelectric layer 3 is preferably 10 nm or more and 1000 nm or less, more preferably 20 nm or more and 800 nm or less, and still more preferably 50 nm or more and 500 nm or less.

The thickness can be adjusted using various parameters such as gas flow rate or deposition time. The thickness is obtained as an average value of 10 measurement data points obtained with a scanning electron microscope (SEM) for the produced spin modulation element 100. When the layers are each thin with a thickness of only several atoms, the thickness can be obtained from the number of atoms measured by a transmission electron microscope (TEM).

If the sum of the thicknesses of the multiferroic layer 2 and the ferroelectric layer 3 is too small, sufficient ferroelectric properties may sometimes not be exhibited. In addition, the electric field inside either the multiferroic layer 2 or the ferroelectric layer 3 becomes strong, which may cause dielectric breakdown, impairing its function as a dielectric layer. On the other hand, if the sum of the thicknesses of the multiferroic layer 2 and the ferroelectric layer 3 is too great, the absolute amount of charge accumulated between the ferromagnetic layer 1 and the multiferroic layer 2 becomes small, thus reducing the second influence that the multiferroic layer 2 exerts on the ferromagnetic layer 1.

The thickness of the multiferroic layer 2 is preferably 5 nm or more and 500 nm or less, more preferably 10 nm or more and 450 nm or less, and still more preferably 15 nm or more and 400 nm or less.

If the multiferroic layer 2 is too thin, sufficient ferroelectric properties may sometimes not be exhibited.

In addition, the electric field inside the multiferroic layer 2 becomes strong, which may cause dielectric breakdown, impairing its function as a dielectric. On the other hand, if the multiferroic layer 2 is too thick, the absolute amount of charge accumulated between the ferromagnetic layer 1 and the multiferroic layer 2 becomes small, thus reducing the second influence that the multiferroic layer 2 exerts on the ferromagnetic layer 1.

The thickness of the ferroelectric layer 3 is preferably 5 nm or more and 500 nm or less, more preferably 10 nm or more and 450 nm or less, and still more preferably 15 nm or more and 400 nm or less.

If the ferroelectric layer 3 is too thin, sufficient ferroelectric properties may sometimes not be exhibited. In addition, the electric field inside the ferroelectric layer 3 becomes strong, which may cause dielectric breakdown, impairing its function as a dielectric layer. On the other hand, if the ferroelectric layer 3 is too thick, the capacitance of the capacitor formed by the ferromagnetic layer 1, the multiferroic layer 2, the ferroelectric layer 3, and the conductive layer is reduced, and therefore the absolute amount of charge accumulated between the ferromagnetic layer 1 and the multiferroic layers 2 becomes small, thus reducing the second influence.

The ferroelectric layer 3 is not particularly limited as long as the permittivity thereof is greater than that of the multiferroic layer 2. For example, $La_xSr_{1-x}MnO_3$ ($0 \leq x \leq 1$), $Ba_xSr_{1-x}TiO_3$ ($0 \leq x \leq 1$), or $PbZr_xTi_{1-x}O_3$ ($0 \leq x \leq 1$)) can be used.

The relative permittivity of the ferroelectric layer 3 is preferably 10 or more and 10,000 or less, more preferably 20 or more and 9,000 or less, and still more preferably 30 or more and 8000 or less. If the relative permittivity of the ferroelectric layer 3 is great, the capacitance of the capacitor formed by the ferromagnetic layer 1, the multiferroic layer 2, the ferroelectric layer 3, and the conductive layer increases, and thus the absolute amount of accumulated charge at the interface between the ferromagnetic layer 1 and the multiferroic layer 2 can be increased.

<Nonmagnetic Layer>

The nonmagnetic layer 20 may be an insulator, a semiconductor, or a metal. When the nonmagnetic layer 20 is made of an insulator, a laminate including ferromagnetic layer 1, the nonmagnetic layer 20, and the second ferromagnetic layer 30 forms a tunneling magnetoresistance (TMR) element, and when the nonmagnetic layer 20 is made of a semiconductor or a metal, a laminate including the ferromagnetic layer 1, the nonmagnetic layer 20, and the second ferromagnetic layer 30 forms a giant magnetoresistance (GMR) element.

A known material can be used for the nonmagnetic layer 20. For example, when the nonmagnetic layer 20 is made of an insulator or a semiconductor, Hexagonal-BN, Graphene, $HfO_2$, $Y_2O_3$, TaO, GaO, TiO, InO, BaO, $CaF_2$, $Al_2O_3$, $SiO_2$, MgO, $MgAl_2O_4$, or the like can be used as a material thereof. Of these, MgO and $MgAl_2O_4$ are materials that can realize coherent tunneling and thus can increase the MR rate. A material obtained by substituting all or part of Mg and Al in MgO and $MgAl_2O_4$ by Zn, Cd, Ag, Pt, Pb, Ga, In, Ge, or the like can also be used for the nonmagnetic layer 20.

When the nonmagnetic layer 20 is made of a metal, Cu, Au, Ag, or the like can be used as a material thereof.

<Second Ferromagnetic Layer>

The second ferromagnetic layer 30, together with the ferromagnetic layer 1 and the nonmagnetic layer 20, forms a magnetoresistance effect element. When the ferromagnetic layer 1 is a fixed layer, the second ferromagnetic layer 30 is a free layer, and when the ferromagnetic layer 1 is a free layer, the second ferromagnetic layer 30 is a fixed layer.

A known material can be used for the second ferromagnetic layer 30. For example, a metal selected from the group consisting of Cr, Mn, Co, Fe and Ni and alloys exhibiting ferromagnetism and containing at least one of these metals can be used. An alloy containing these metals and at least one of the elements B, C, and N can also be used. Specifically, Co—Fe or Co—Fe—B can be used. In order to obtain a higher output, a Heusler alloy may be used for the second ferromagnetic layer 30.

As described above, the spin modulation element according to the present embodiment includes the ferroelectric layer 3, and therefore a sufficient electric field can be applied to the ferromagnetic layer 1. As a result, it is possible to sufficiently modulate the spin polarization rate of the ferromagnetic material and to reliably hold data in multiple values.

(Method of Manufacturing Spin Modulation Element)

A method of manufacturing the spin modulation element 100 will now be described. First, a base material is prepared.

It is preferable that a material having conductivity be used as the base material to apply a voltage in the lamination direction of the laminated structure 10. The base material can also serve as an electrode since the base material has conductivity.

Next, the ferroelectric layer 3, the multiferroic layer 2, the ferromagnetic layer 1, the nonmagnetic layer 20, and the second ferromagnetic layer 30 are sequentially laminated on the prepared base material. These layers can be laminated in the same manner as a ferromagnetic layer and a nonmagnetic layer of a magnetoresistance effect element such as a GMR element or a TMR element. For example, a sputtering method, an evaporation method, a laser ablation method, a chemical vapor deposition (CVD) method, a molecular beam epitaxial (MBE) method, or the like can be used.

Further, it is preferable that an electrode be laminated on a surface of the second ferromagnetic layer 30 opposite to the nonmagnetic layer 20. Providing the electrode allows current to flow through the ferromagnetic layer 1 uniformly over the entire surface thereof.

(Operation of Spin Modulation Element)

Next, the operation of the spin modulation element will be described and how a multi-valued spin modulation element is realized will also be described.

FIG. 2A to 2D are schematic diagrams illustrating the operation of the spin modulation element 100. The spin modulation element 100 is connected to a switch SW1 for controlling current flowing through the second ferromagnetic layer 30 and the ferromagnetic layer 1 and a switch SW2 for applying an electric field to the multiferroic layer 2 and the ferroelectric layer 3.

Figure 2A:
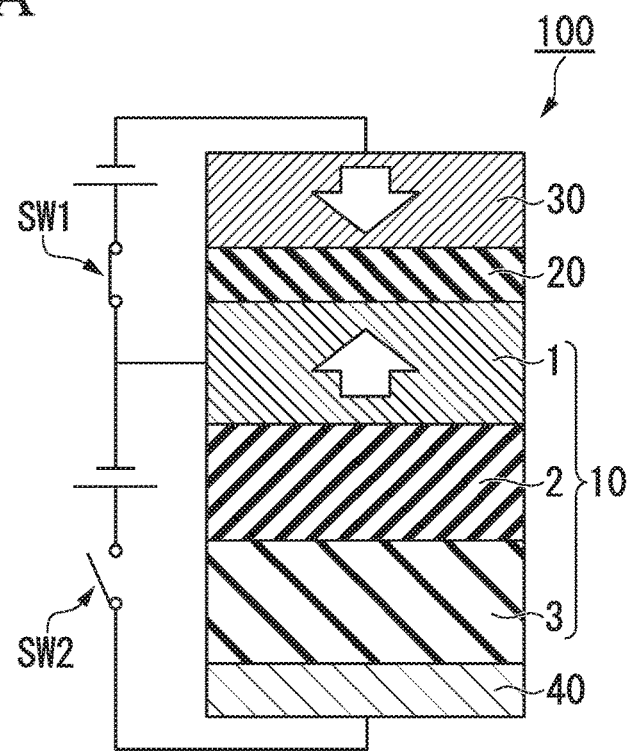
FIG. 2A is a schematic diagram illustrating the operation of the spin modulation element.
Figure 2B:
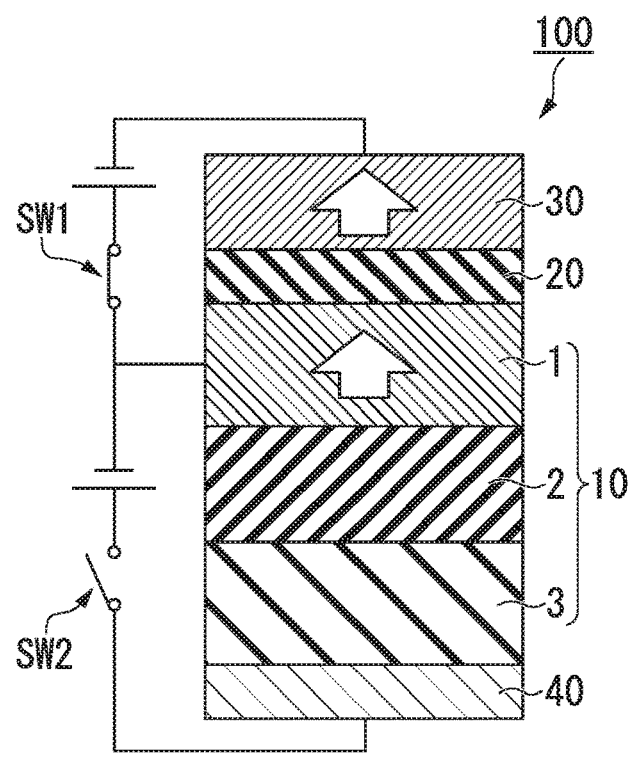
FIG. 2B is a schematic diagram illustrating the operation of the spin modulation element.

First, as shown in FIGS. 2A and 2B, when the switch SW2 is open, no electric field is applied to the multiferroic layer 2. Therefore, the spin modulation element 100 has two states, a first state in which the magnetization directions of the second ferromagnetic layer 30 and the ferromagnetic layer 1 are antiparallel (FIG. 2A) and a second state in which the magnetization directions of the second ferromagnetic layer 30 and the ferromagnetic layer 1 are parallel (FIG. 2B). By closing the switch SW1, a spin-polarized current is caused to flow in the laminating direction of the laminate and the magnetization direction of the ferromagnetic layer 1 is reversed through the spin transfer torque (STT).

Figure 2C:
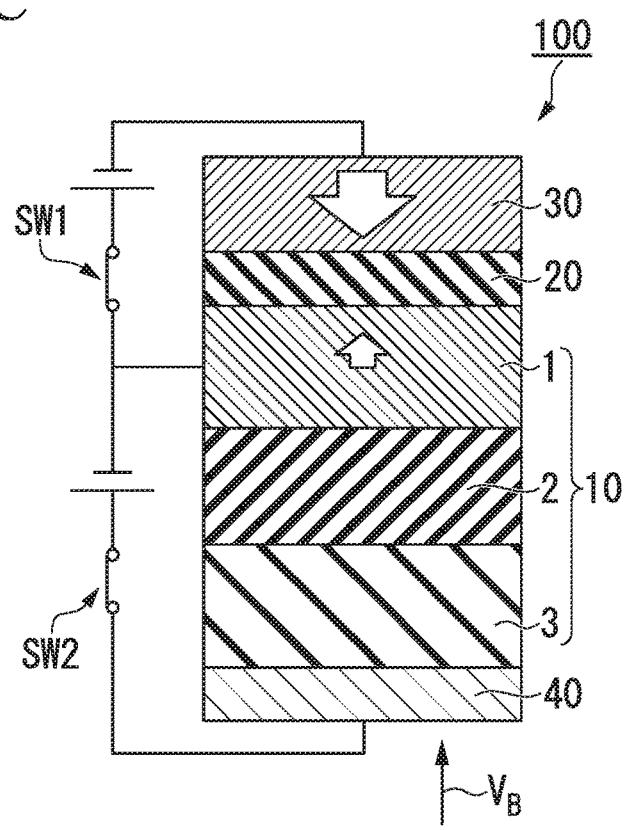
FIG. 2C is a schematic diagram illustrating the operation of the spin modulation element.
Figure 2D:
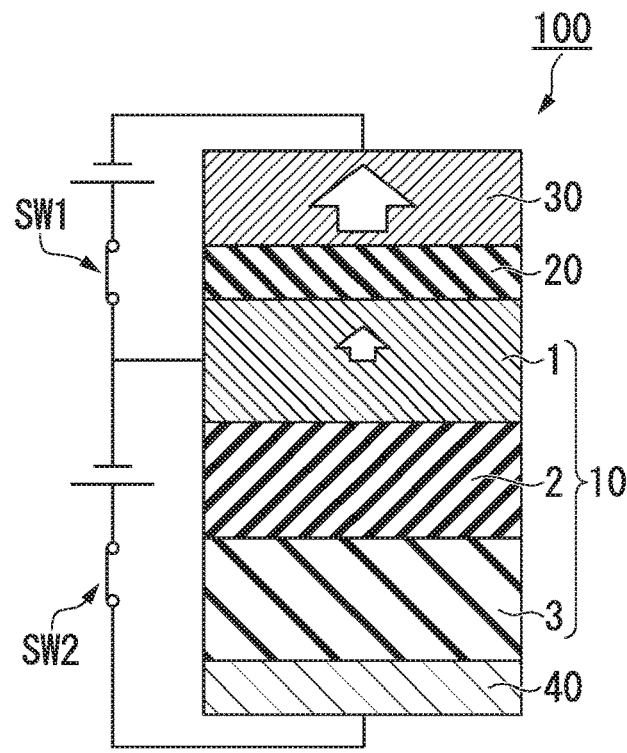
FIG. 2D is a schematic diagram illustrating the operation of the spin modulation element.

Next, as shown in FIGS. 2C and 2D, the switch SW2 is closed to apply an electric field (to the multiferroic layer 2 and the ferroelectric layer 3) between the ferromagnetic layer 1 and the electrode 40. When an electric field is applied to the multiferroic layer 2 and the ferroelectric layer 3, the direction of dielectric polarization is reversed each of the multiferroic layer 2 and the ferroelectric layer 3. An electric field generated by the dielectric polarization changes the band structure of the ferromagnetic layer 1 and modulates the spin polarization rate of the ferromagnetic layer 1.

For example, when a positive voltage is applied to the multiferroic layer 2 and the ferroelectric layer 3 (in the direction of voltage $V_B$ in FIG. 2C), band bending is induced in the down-spin band structure of the ferromagnetic layer 1 through a corresponding electric field. Therefore, a small number of spin carriers are induced at an interface in the ferromagnetic layer 1 adjacent to the multiferroic layer 2, and the spin polarization rate of the ferromagnetic layer 1 decreases. In FIGS. 2C and 2D, the decrease of the spin polarization rate is schematically shown by the size of arrows.

As shown in FIGS. 2C and 2D, also with the spin polarization rate of the ferromagnetic layer 1 decreased, the spin modulation element 100 has two states, a third state in which the magnetization directions of the second ferromagnetic layer 30 and the ferromagnetic layer 1 are antiparallel (FIG. 2C) and a fourth state in which the magnetization directions of the second ferromagnetic layer 30 and the ferromagnetic layer 1 are parallel (FIG. 2D).

That is, controlling the switch SW1 and the switch SW2 allows the spin modulation element 100 to produce four states. The first state, the third state, the fourth state, and the second state are in increasing order of resistance.

Since the spin modulation element 100 has the ferroelectric layer 3 on the multiferroic layer 2 opposite to the ferromagnetic layer 1, a sufficient electric field is applied to the ferromagnetic layer 1. Therefore, the change in the spin polarization rate depending on the dielectric polarization increases such that the differences in resistance between the first state and the third state and between the second state and the fourth state increase. As a result, it is possible to perform reliable multi-valued recording.

While preferred embodiments of the invention have been described and illustrated above using figures, it should be understood that these are exemplary of the invention and are not to be considered as limiting. Additions, omissions, substitutions, and other modifications can be made without departing from the spirit or scope of the present invention. Accordingly, the invention is not to be considered as being limited by the foregoing description, and is only limited by the scope of the appended claims.

The laminated structure and the spin modulation element according to the above aspects can sufficiently modulate the spin polarization rate of the ferromagnetic material through an electric field.

EXPLANATION OF REFERENCES

1 Ferromagnetic layer
2 Multiferroic layer
3 Ferroelectric layer
10 Laminated structure
20 Nonmagnetic layer
30 Second ferromagnetic layer
40 Electrode
100 Spin modulation element
SW1, SW2 Switch

What is claimed is:

1. A laminated structure comprising:
  a ferromagnetic layer;
  a multiferroic layer provided on one surface of the ferromagnetic layer; and
  a ferroelectric layer provided on the multiferroic layer opposite to the ferromagnetic layer, wherein the ferroelectric layer has a permittivity greater than a permittivity of the multiferroic layer.

2. The laminated structure according to claim 1, wherein a sum of thicknesses of the multiferroic layer and the ferroelectric layer is 10 nm or more and 1000 nm or less.

3. The laminated structure according to claim 1, wherein the thickness of the multiferroic layer is 5 nm or more and 500 nm or less.

4. The laminated structure according to claim 1, wherein the thickness of the ferroelectric layer is 5 nm or more and 500 nm or less.

5. The laminated structure according to claim 1, wherein the ferroelectric layer has a relative permittivity of 10 or more.

6. The laminated structure according to claim 1, wherein the ferroelectric layer is $La_xSr_{1-x}MnO_3$ ($0 \leq x \leq 1$), $Ba_xSr_{1-x}TiO_3$ ($0 \leq x \leq 1$), or $PbZr_xTi_{1-x}O_3$ ($0 \leq x \leq 1$).

7. The laminated structure according to claim 1, wherein the ferromagnetic layer is a half-metal.

8. The laminated structure according to claim 1, wherein the ferromagnetic layer includes a Heusler alloy represented by a composition formula of $X_2YZ$, where X is a transition metal element or a noble metal element of the Co, Fe, Ni or Cu group on the periodic table, Y is a transition metal of the Mn, V, Cr or Ti group or an element type of X, and Z is a typical element of groups III to V.

9. The laminated structure according to claim 1, wherein the multiferroic layer includes any one selected from the group consisting of $BiFeO_3$, $BiMnO_3$, $GaFeO_3$, $AlFeO_3$, $(Ga, Al)FeO_3$, $YMnO_3$, $CuFeO_2$, $Cr_2O_3$, $Ni_3Bi_7O_{13}I$, $LiMnPO_4$, $Y_3Fe_5O_{12}$, $TbPO_4$, and $LiCoPO_4$.

10. A spin modulation element comprising:
    the laminated structure according to claim 1; and
    a nonmagnetic layer and a second ferromagnetic layer sequentially laminated on the ferromagnetic layer of the laminated structure.

11. The laminated structure according to claim 1, further comprising an electrode provided on the ferroelectric layer opposite to the multiferroic layer.

12. The spin modulation element according to claim 10, further comprising an electrode provided on the ferroelectric layer opposite to the multiferroic layer.

* * * * *